United States Patent
Groe et al.

(10) Patent No.: US 6,985,703 B2
(45) Date of Patent: Jan. 10, 2006

(54) DIRECT SYNTHESIS TRANSMITTER

(75) Inventors: John B. Groe, Poway, CA (US);
Joseph Austin, San Diego, CA (US);
Naone Farias, San Diego, CA (US);
Carrie Lo, Irvine, CA (US)

(73) Assignee: Sequoia Corporation, San Diego, CA (US)

(*) Notice: Subject to any disclaimer, the term of this patent is extended or adjusted under 35 U.S.C. 154(b) by 434 days.

(21) Appl. No.: 10/265,215

(22) Filed: Oct. 4, 2002

(65) Prior Publication Data

US 2003/0078016 A1 Apr. 24, 2003

Related U.S. Application Data

(60) Provisional application No. 60/375,781, filed on Apr. 26, 2002, and provisional application No. 60/327,081, filed on Oct. 4, 2001.

(51) Int. Cl.
*H03C 1/52* (2006.01)
*H04B 1/02* (2006.01)

(52) U.S. Cl. .................. 455/108; 455/113; 332/145

(58) Field of Classification Search ............... 455/110, 455/112, 113, 118, 127.2, 108; 375/302, 300; 332/103, 144, 145, 149
See application file for complete search history.

(56) References Cited

U.S. PATENT DOCUMENTS

| | | | | |
|---|---|---|---|---|
| 5,991,605 A | * | 11/1999 | Rapeli | 455/76 |
| 2002/0071497 A1 | * | 6/2002 | Bengtsson et al. | 375/298 |
| 2003/0118143 A1 | * | 6/2003 | Bellaouar et al. | 375/376 |

* cited by examiner

*Primary Examiner*—Nguyen T. Vo

(57) ABSTRACT

A direct synthesis transmitter. A very efficient and highly linear direct synthesis transmitter is provided that can be used to directly synthesize and transmit any type of modulated signal. The direct synthesis transmitter includes a phase-locked loop (PLL) with controls phase modulation plus an accompanying variable gain amplifier for amplitude modulation. Also included is a system to align the phase and amplitude modulation signals. A transmitter constructed in accordance with the present invention is very efficient and suitable for use in portable radio equipment.

1 Claim, 7 Drawing Sheets

US 6,985,703 B2

DIRECT SYNTHESIS TRANSMITTER

CROSS REFERENCE TO RELATED APPLICATIONS

The present invention claims the benefit of priority of a co-pending U.S. Provisional Patent Application Ser. No. 60/327,081 entitled "Direct Synthesis Transmitter" filed on Oct. 4, 2001, the disclosure of which is incorporated herein in its entirety for all purposes.

The present invention also claims the benefit of priority of a co-pending U.S. Provisional Patent Application Ser. No. 60/375,781 entitled "Direct Synthesis Transmitter" filed on Apr. 26, 2002, the disclosure of which is incorporated herein in its entirety for all purposes.

FIELD OF THE INVENTION

The present invention relates generally to radio transmitters, and more particularly, to an efficient and highly linear transmitter architecture to perform direct synthesis of a modulated signal.

BACKGROUND OF THE INVENTION

A transmitter generates radio signals required for communications. It consists of a data source, modulator and power amplifier (PA), as shown in FIG. 1. The modulator varies the amplitude, phase, and/or frequency of a carrier signal depending on the communication method selected.

FIG. 2 shows a detailed diagram of a standard radio transmitter architecture. It uses two mixers (202, 204) to generate the modulated signal and a third mixer (206) to shift the signal to radio frequency for propagation using electromagnetic waves. It relies on high-Q filters (208, 210) that are difficult to integrate but are needed to limit broadband noise and spurs. This architecture typically operates at high current levels, which limits its usefulness in portable radio equipment. It would therefore be advantageous to have a more efficient radio transmitter architecture that is more suitable for use in portable radio equipment.

SUMMARY OF THE INVENTION

The present invention provides a very efficient and highly linear direct synthesis transmitter that can be used to directly synthesize and transmit any type of modulated signal. In one embodiment, the direct synthesis transmitter includes a phase-locked loop (PLL) with controls phase modulation plus an accompanying variable gain amplifier for amplitude modulation. Also included is a system to align the phase and amplitude modulation signals. A transmitter constructed in accordance with the present invention is very efficient and suitable for use in portable radio equipment.

In one embodiment included in the present invention, apparatus is provided for direct synthesis of a modulation waveform. The apparatus includes a fractional-N phase-locked loop circuit that includes a counter in the feedback loop controlled by a $\Delta\Sigma$ modulator, wherein a sequence output produced by the $\Delta\Sigma$ modulator alternates between integer values to resolve a fractional N value. The apparatus also includes a two-port voltage-controlled oscillator, the first port receives a control voltage for the phase-locked loop and the second port receives a direct modulation signal. The apparatus also includes a second input to the fractional-N phase-locked loop to remove the modulation applied at the voltage-controlled oscillator. The apparatus also includes a variable gain amplifier that receives the sequence output of the phase-locked loop and an amplitude-control signal, wherein an envelope characteristic of the phase-modulated signal produced by the phase-locked loop is modulated. The apparatus also includes a phase data input circuit that receives the phase modulation data, differentiates the data, and routes the differentiated data to the second input of the fractional-N phase-locked loop as well as the second port of the voltage-controlled oscillator. Lastly, the apparatus includes an amplitude data input circuit that receives amplitude data and produces a signal that is coupled to a variable gain amplifier, wherein the phase data and the amplitude data experience substantially the same signal delay.

In another embodiment included in the present invention, a method is provided for direct synthesis of a modulation waveform. The method comprises steps of operating a phase-locked loop circuit that includes a two-port voltage-controlled oscillator and a fractional-N counter, using a voltage-controlled oscillator with two control ports, one for frequency control and the second for direct modulation, using a fractional-N counter, programmed by a high-data rate sequence, the sequence formed by a $\Delta\Sigma$ modulator and the differentiated phase modulation signal, operating a variable gain amplifier that receives the amplitude modulation signal, and using similar paths for the phase modulation data and the amplitude modulation data to avoid any substantial delay differences.

In another embodiment included in the present invention, apparatus is provided for alignment of phase and amplitude modulation data input to a direct synthesis modulator that includes a phase-locked loop. The apparatus comprises a phase input circuit that receives the phase data, differentiates the data, and produces a phase output signal coupled to the phase-locked loop when triggered, utilizing a $\Delta\Sigma$ modulator, digital-to-analog to-analog converter, low-pass filter, and buffer amplifier. The apparatus also comprises an amplitude input circuit that receives the amplitude data and produces a amplitude output signal coupled to the variable gain amplifier when triggered, utilizing the same stages as the phase input circuit—a $\Delta\Sigma$ modulator, digital-to-analog converter, low-pass filter, and buffer amplifier. Lastly, the apparatus also comprises an alignment network coupled to the output of the N counter that generates a signal to trigger the phase and amplitude data circuits.

BRIEF DESCRIPTION OF THE DRAWINGS

The foregoing aspects and the attendant advantages of the invention will become more readily apparent by reference to the following detailed description when taken in conjunction with the accompanying drawings wherein:

FIG. 5 shows a detailed diagram of one embodiment of logic used to control the N counter of the PLL of FIG. 4a;

DETAILED DESCRIPTION

Figure 1:
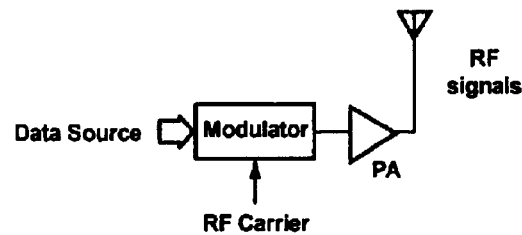
FIG. 1 shows a block diagram of a typical radio transmitter.
Figure 2:
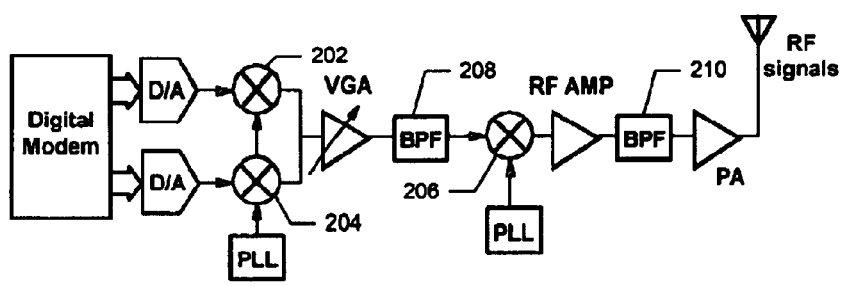
FIG. 2 shows a detailed diagram of the transmitter of FIG. 1.
Figure 3:
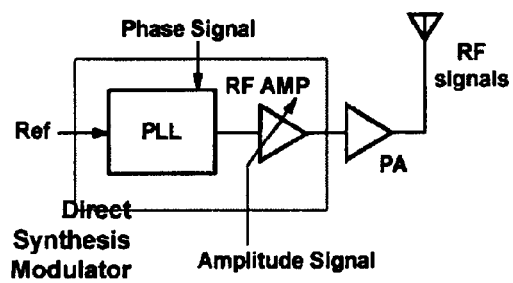
FIG. 3 shows a block diagram of a direct synthesis modulator constructed in accordance with the present invention.

FIG. 3 shows a block diagram of a direct synthesis modulator constructed in accordance with the present invention. The direct synthesis modulator includes an auxiliary control port to the radio frequency VCO for phase modulation and includes a VGA for envelope (amplitude) control. The modulator provides a "spectrally clean" signal and consumes very little power. However, the spectral shape of the modulated signal depends on the timing accuracy of the separately applied phase and amplitude modulation signals.

Figure 4A:
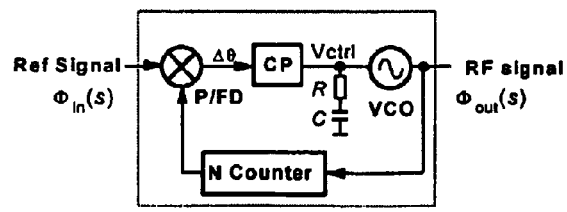
FIGS. 4a–b show a detailed diagram and associated mathematical model of a phase-locked loop for use in the direct synthesis transmitter of FIG. 3.

FIG. 4a shows a detailed diagram of a phase-locked loop (PLL) for use in the direct synthesis modulator of FIG. 3. The PLL comprises a feedback system that includes a voltage-controlled oscillator (VCO), N counter, phase/frequency detector (P/FD), and charge pump (CP).

Figure 4B:
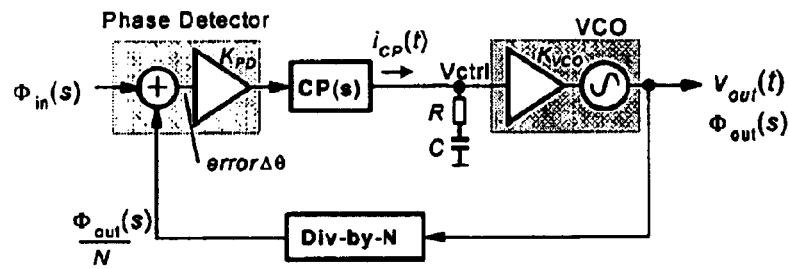

FIG. 4b shows a mathematical model of the PLL of FIG. 4a. The VCO produces an output signal at a frequency set by control voltage $v_{ctrl}$, and expressed as:

$$v_{out}(t) = A_c \cos(\omega_{free} t + K_{vco} \int v_{ctrl}(t) dt)$$

where $\omega_{free}$ is the free-running frequency of the oscillator and $K_{vco}$ is its gain function. The gain function $K_{vco}$ describes the relationship between the excess phase of the carrier $\Phi_{out}(s)$ and the control voltage $v_{ctrl}$, thus:

$$\frac{\Phi_{out}(s)}{v_{ctrl}(s)} = \frac{K_{vco}}{s}$$

The N counter simply divides the output phase $\Phi_{out}(s)$ by N. When the PLL is locked, the phase/frequency detector and charge pump combination generate an output signal proportional to the phase difference $\Delta\theta$ between two periodic input signals expressed as:

$$i_{CP}(s) = K_{PD} \frac{\Delta\theta(s)}{2\pi}$$

A simple integration filter, consisting of resistor R and capacitor C, transforms the output signal to the control voltage defined by:

$$v_{ctrl}(s) = i_{CP}(s)\left(R + \frac{1}{sC}\right)$$

Combining the above transfer functions yields the composite transfer function;

$$T(s) = \frac{K_{PD} K_{VCO}\left(Rs + \frac{1}{C}\right)}{s^2 + K_{PD} K_{VCO} \frac{1}{N}\left(Rs + \frac{1}{C}\right)}$$

where a zero (at 1/RC) has been added to the second order system to stabilize it.

The PLL generates an output signal at the frequency;

$$f_{VCO} = N f_{REF}$$

where N is the value of the counter. In a fractional-N PLL, N takes on fractional values by alternating between integer values of the counter. The alternating process is typically controlled and randomized by a $\Delta\Sigma$ modulator, which has the benefit of shaping spurious energy (due to the alternating of N) outside the bandwidth of the PLL's low pass filter.

Figure 5:
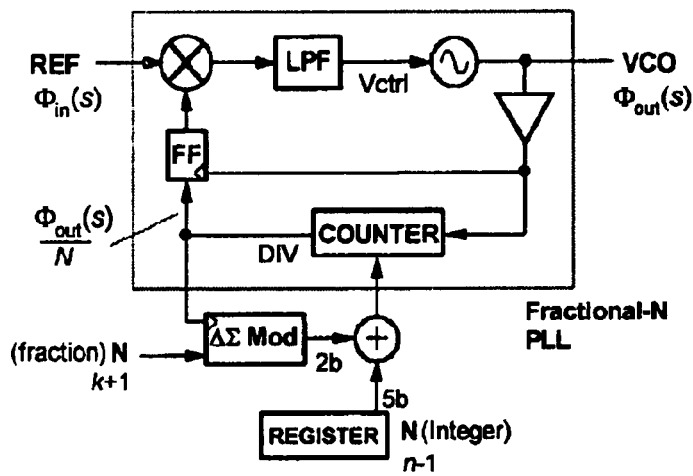
Figure 6:
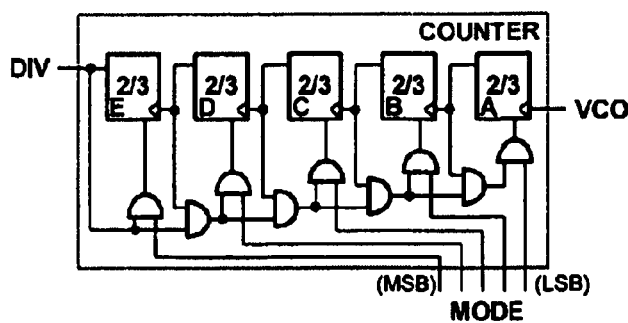
FIG. 6 shows a diagram of a counter for use in the PLL of FIG. 5.

FIG. 5 shows a detailed diagram of one embodiment of logic used to control the N counter. The N counter realizes a multi-modulus prescaler formed by cascading multiple divide-by-2/divide-by-3 sections as shown in FIG. 6. Each section is controlled by a single input or bit, which selects the mode of operation.

Figure 7:
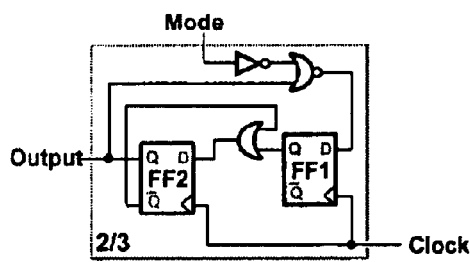
FIG. 7 shows a diagram of a divide circuit for use in the counter of FIG. 6.
Figure 8:
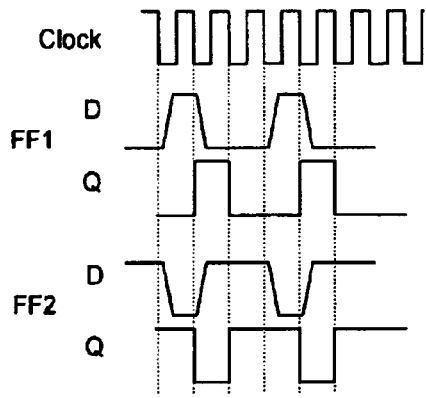
FIG. 8 shows a timing diagram associated with the divide circuit of FIG. 7.

FIG. 7 shows a diagram of a divide-by-⅔ section shown in FIG. 6. With the mode input low, the Q output of the first flip-flop (FF1) is forced low, connecting the /Q output directly to the D input of the second flip-flop (FF2). This connection divides the clock signal by two. With the mode input high, the Q output of FF2 is inverted and routed to the D input of FF1. The resulting logic causes the Q output of FF1 to pulse high, extending the D input and consequently the Q output of FF2 an extra cycle of the clock signal as shown in the timing diagram of FIG. 8. This operation provides the divide-by-3 function. Note that the mode input selecting the divide-by-3 operation must be set before the output of FF2 transitions high.

The 5-bit multi-modulus prescaler counter starts at count 0 and progresses towards count 16. At count 16, the output of the divide-by-⅔ section F (left-most section) transitions high, setting its mode of operation. If the mode input to this section ($M_4$) is high, the prescaler counts an extra cycle of the output signal produced by the previous divide-by-⅔ section (D), which is equivalent to 16 extra cycles of the VCO signal. The operating mode of the next (moving left to right) divide-by-⅔ section (D) is set at count 24. This section counts 8 extra cycles of the VCO signal when operating in divide-by-3 mode. The programming pattern continues through the first three sections (C, B, and A) and allows the 5-bit multi-modulus prescaler to count a programmable number of cycles of the VCO signal, from 32 to 63, with $$N = 32 + 16M_4 + 8M_3 + 4M_2 + 2M_1 + M_0$$

where M is the mode input.

Figure 9:
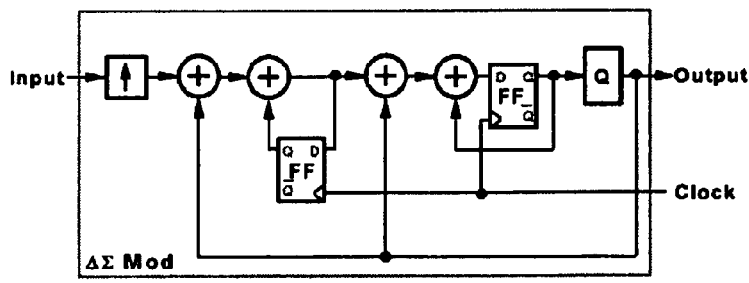
FIG. 9 shows a diagram of a delta-sigma circuit for use in the PLL of FIG. 5.
Figure 10:
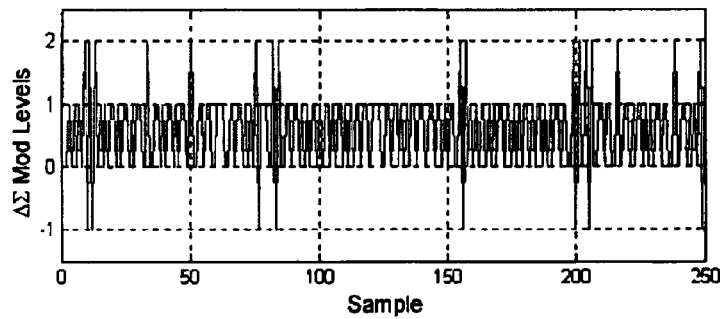
FIG. 10 shows a graph illustrating the operation of the delta-signal circuit of FIG. 9.

The output signal from the N counter drives the clock of the ΔΣ modulator shown in FIG. 9. When the clock signal transitions low—indicating that the N counter has cycled completely through—it toggles the flip-flops in the ΔΣ modulator. This triggers the next state in the randomized 2-bit sequence shown in FIG. 10. The average value of this sequence corresponds to the fractional part of N plus one (k+1). The offset shifts nominal ΔΣ modulator sequence {−1,0,1,2} to {0,1,2,3}. This allows a simple adder structure to achieve the proper prescaler control provided the integer part of N is offset by negative one (n−1). That is;

$$n+k \rightarrow (n-1)+(k+1)$$

which is still equivalent to N and capable of prescaler values {n−1, n, n+1, n+2}.

Figure 11:
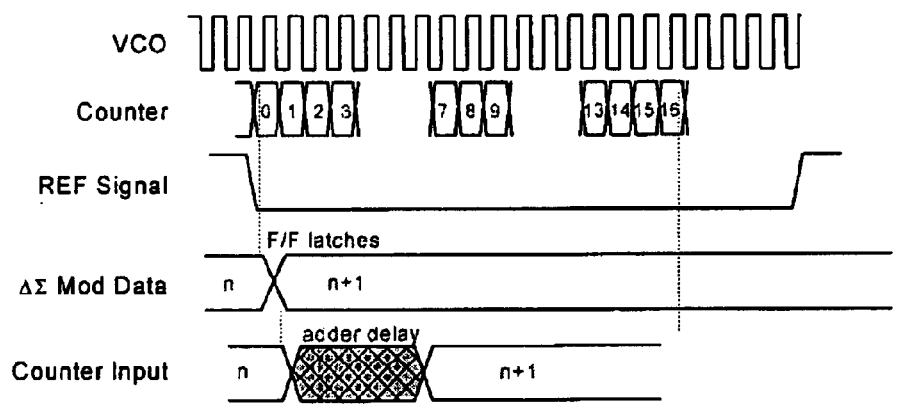
FIG. 11 shows a timing diagram illustrating the operation of the N counter logic of FIG. 5.

The timing associated with the N counter logic is shown in FIG. 11. To ensure proper control of the multi-modulus precaler (N counter), the propagation delay through the ΔΣ modulator and adder must be less than 16 cycles of the VCO signal. This timing can be relaxed by advancing the trigger by the minimum propagation delay through the ΔΣ modulator.

Figure 12:
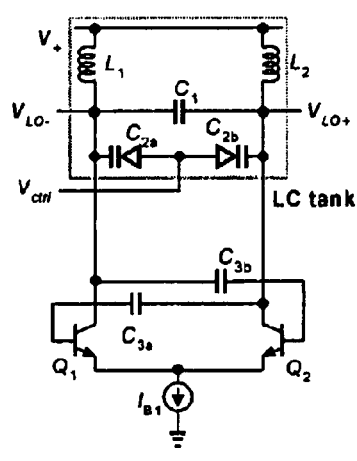
FIG. 12 shows one embodiment of a differential LC oscillator in accordance with the present invention.

In one embodiment, the fractional-N PLL uses the VCO shown in FIG. 12 to generate its radio frequency output signal. The VCO oscillates at a frequency set by the resonance of an LC tank circuit. A variable capacitor $C_2$—usually realized as a varactor diode—allows the oscillator to be tuned to different radio frequencies. Capacitors $C_3$ cross-couple the output signal (and thereby provide positive feedback) to the transistor differential pair (Q1, Q2) to replace energy lost in the resonant LC tank and thereby sustain oscillation.

Figure 13:
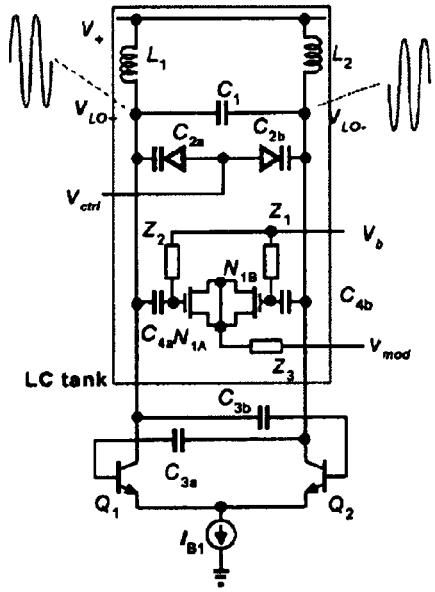
FIG. 13 shows a second embodiment of a differential LC oscillator in accordance with the present invention.

In one embodiment, the direct synthesis modulator adds an auxiliary control port to the VCO by shunting a second variable capacitor (realized by MOSFET capacitor $N_1$) across the resonant LC tank as shown in FIG. 13. This adjustable capacitor tends to be small and produces small offsets in the oscillating frequency. Note that optional capacitor C4 provides DC blocking.

Figure 14:
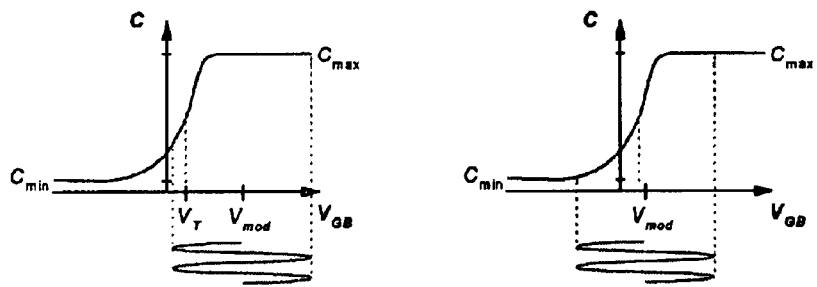
FIG. 14 shows graphs illustrating the operation of the oscillators of FIGS. 12 and 13.

It is important for the VCO to respond linearly to the phase signal and thereby achieve accurate phase modulation. In this circuit, the MOSFET acts as the variable capacitor even though it individually displays the abrupt response seen in FIG. 14. A linear VCO response results because of the way the transistor is used. The MOSFET transistor is nominally biased at its threshold voltage ($V_T$), corresponding to the transition in the capacitance curve;

$$V_{GB(nom)} = V_+ - V_{mod} = V_T$$

where $V_{GB}$ is the applied gate-to-bulk voltage. As the VCO output swings, the bias applied to the MOSFET switches its capacitance between two extreme values, $C_{min}$ and $C_{max}$, effectively averaging the two values. But, the phase modulation signal ($v_{mod}$) also affects the bias applied to the MOSFET capacitor. It shifts the time the MOSFET spends at each capacitance value, and since the time shifts linearly (with $v_{mod}$), the capacitance changes linearly with;

$$C_4 = \alpha C_{max} + (1-\alpha) C_{min}$$

where α is the time (expressed as a percentage of a cycle of the VCO signal) the MOSFET presents capacitance $C_{max}$, or equivalently, the time that $V_{GB} > V_T$.

Figure 15:
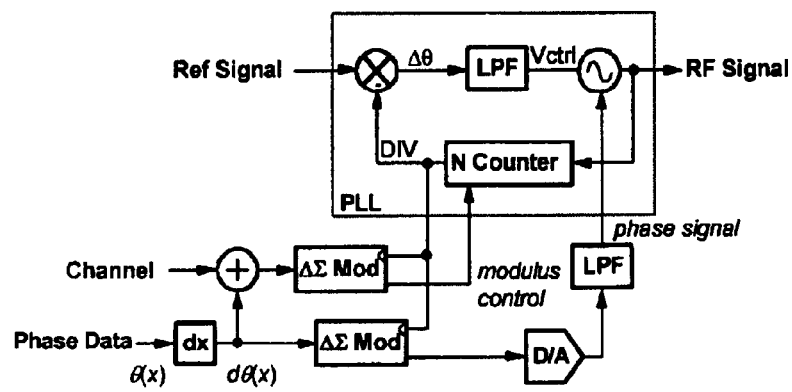
FIG. 15 shows a block diagram of a first embodiment of the phase modulation signal path in accordance with the present invention.
Figure 16:
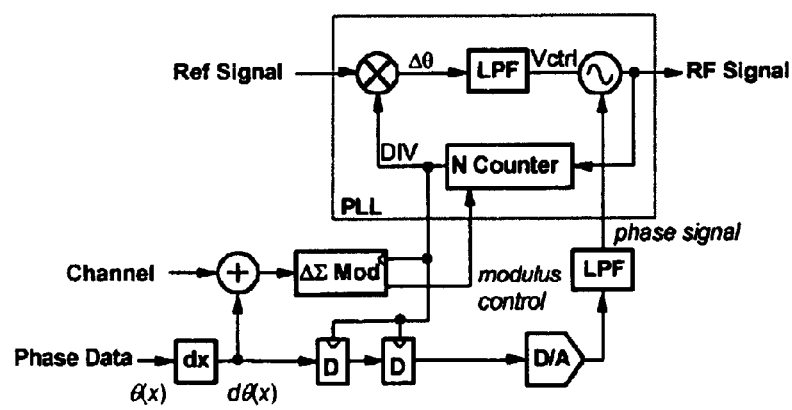
FIG. 16 shows block diagrams of a second embodiment of the phase modulation signal path in accordance with the present invention.

The modulation control port of the VCO adjusts the frequency of the oscillator's output signal, not its phase. To shift the phase of the oscillator's output signal, the phase modulation signal θ(t) must be differentiated with $$f(t) = \frac{d}{dt}[f_c t + \theta(t)] = f_c + \frac{d\theta(t)}{dt}$$

where $f_c$ is the carrier frequency. Since the phase signal is formed digitally and then converted to analog form, a difference circuit, as shown in FIG. 15, is used to compute the derivative of the discrete phase data θ(x);

$$d\theta(x+1) = \theta(x+1) - d\theta(x)$$

where x is the sample index and dθ(x) is the difference or derivative. The differentiated data is then modulated to match the data feeding the N counter. The ΔΣ modulator also provides the benefit of reducing the number of bits and the size of the digital-to-analog converter (D/A). A low pass filter smoothes the phase signal before it is applied to the modulation port of the VCO. The order of the difference circuit and ΔΣ modulator can be switched without any loss in performance. Alternatively, in another embodiment, the differentiated data can be delayed (by two clock cycles to match the delay through the $2^{nd}$ order ΔΣ modulator) and applied directly to a more accurate D/A converter as shown in FIG. 16.

Figure 17:
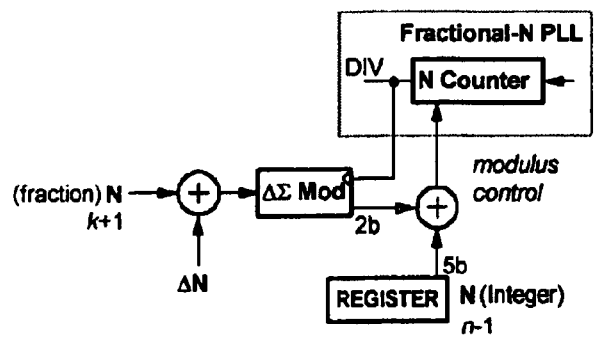
FIG. 17 shows a detailed diagram of a counter interface for use in a direct synthesis modulator in accordance with the present invention.

Feedback associated with the fractional-N PLL actually fights direct modulation of the VCO. To prevent this, the phase modulation needs to be removed from the PLL's feedback loop. This is accomplished as follows. The program value applied to the N counter consists of an integer component and a fractional part as shown in FIG. 17. A ΔΣ modulator produces a pseudo-random 2-bit sequence to alternate between integer values and resolve the fractional part of N. To remove the effects of the direct modulation, the differentiated phase modulation signal, dθ/dt, applied to the VCO is subtracted from the fractional part of N programmed into the N counter.

The N counter is adjusted each time it cycles through, a rate approximately equal to the reference frequency and typically much higher than the phase modulation signal's data rate. In addition, the ΔΣ modulator feeds values to the N counter that randomly alternate above and below the exact fractional N value. As a result, complete cancellation of the modulation by the N counter is not possible or needed—any modulation that leaks through typically occurs at high frequencies and is attenuated by the integration filter.

Figure 18:
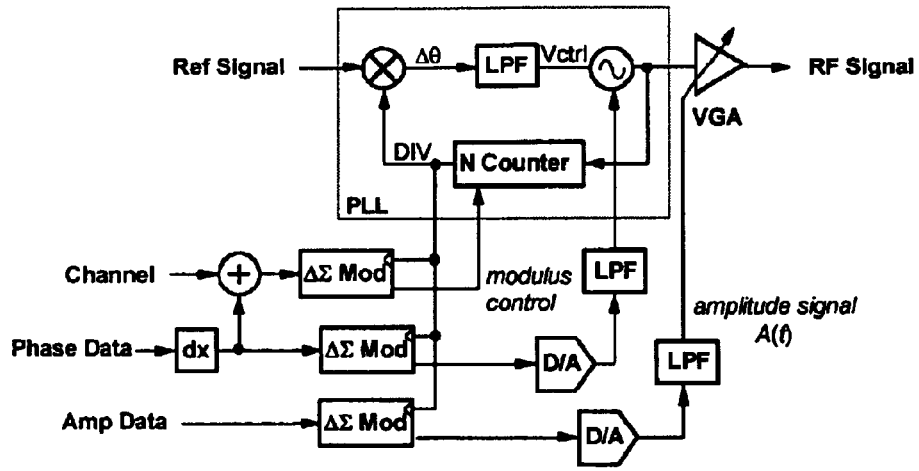
FIG. 18 shows a block diagram of a first embodiment of an amplitude modulation signal path in the direct synthesis modulator in accordance with the present invention.
Figure 19:
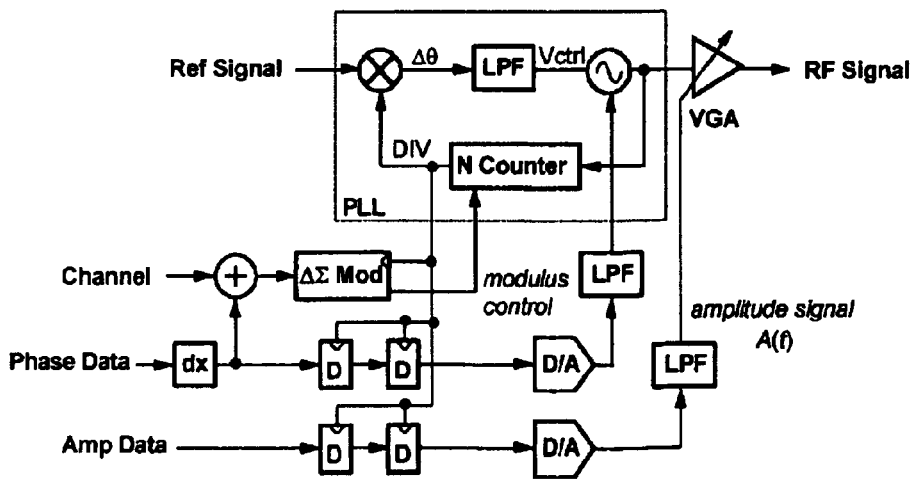
FIG. 19 shows a block diagram of a second embodiment of an amplitude modulation signal path in the direct synthesis modulator in accordance with the present invention.

The fractional-N PLL drives a variable gain amplifier (VGA) that controls the envelope of the modulated signal. It uses the amplitude modulation data that is transformed into an analog control signal A(t) by a ΔΣ modulator, D/A, and LPF as shown in FIG. 18. This signal path duplicates the phase modulation signal path to ensure equal signal delay. In another embodiment, an alternative technique eliminates the ΔΣ modulator by increasing the resolution of the D/A converter as shown in FIG. 19.

Figure 20:
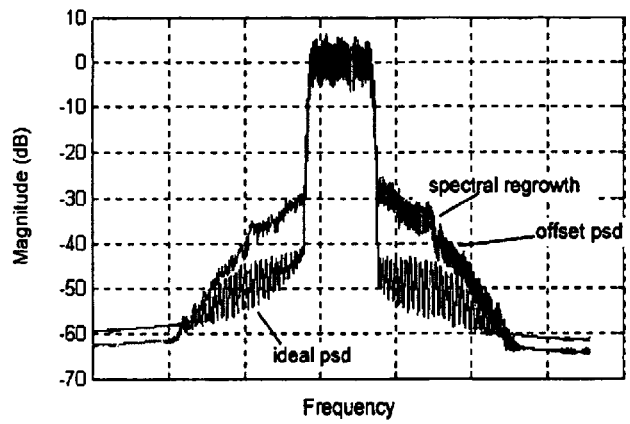
FIG. 20 shows a graph that illustrates the effects of offset delay between phase and amplitude modulation.

It is important for the phase and amplitude signals to align, otherwise the modulated signal becomes distorted and spectral regrowth occurs as shown in FIG. 20. The graph of FIG. 20 shows the power spectral density (psd) of the ideal modulation signal and the modulated signal produced when the phase and amplitude signals are offset by 50 nanoseconds.

Figure 21:
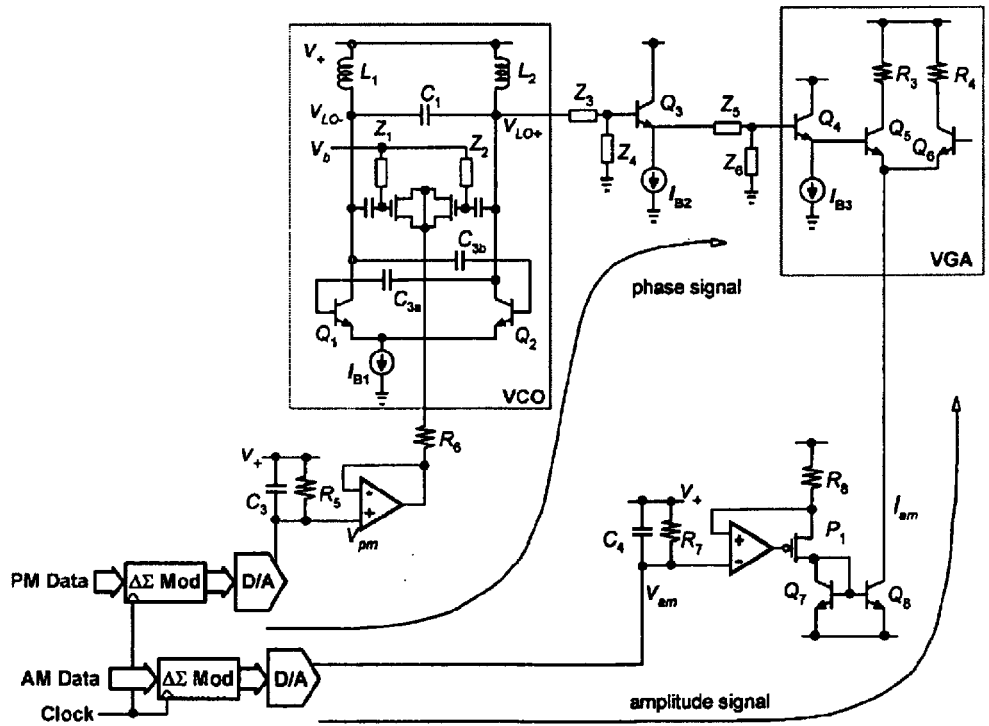
FIG. 21 shows a detailed schematic, with phase and amplitude signal paths, in a direct synthesis modulator in accordance with the present invention.

FIG. 21 shows a detailed schematic constructed in accordance with the present invention that illustrates the phase and amplitude signal paths. At the output of the ΔΣ modulators, the phase and amplitude data are synchronous and are therefore aligned perfectly. These signals in turn feed matched digital-to-analog converters (D/A), smoothing filters, and buffer amplifiers. The phase signal is applied to the MOSFET capacitor through isolation resistor $R_6$, introducing a minor delay. The radio frequency output of the VCO then drives a pair of impedance dividers and buffer stages before the VGA. The delay through these circuits is small to operate effectively at the radio frequencies and can be estimated as;

$$\tau \approx \frac{0.35}{2BW}$$

where BW is the bandwidth of the circuits.

The amplitude signal takes a different route to the VGA. The buffer amplifier provides a current output by including the transistor P1 and resistor R8 in its feedback loop. The resulting current is then mirrored to the VGA. The additional delay through the current mirror is small and on the order of the delay experienced by the phase signal. As a result, the direct synthesis modulator—realized with separate phase and amplitude control—experiences little spectral regrowth.

The present invention includes a very efficient and highly linear direct synthesis transmitter that can be used to directly synthesize and transmit any type of modulated signal. The embodiments described above are illustrative of the present invention and are not intended to limit the scope of the invention to the particular embodiments described. Accordingly, while one or more embodiments of the invention have been illustrated and described, it will be appreciated that various changes can be made therein without departing from the spirit or essential characteristics thereof. Accordingly, the disclosures and descriptions herein are intended to be illustrative, but not limiting, of the scope of the invention, which is set forth in the following claims.

What is claimed is:

1. Apparatus for direct synthesis of a modulation waveform, the apparatus comprising:

a fractional-N phase-locked loop circuit that includes a counter controlled by a $\Delta\Sigma$ modulator, wherein a sequence output produced by the $\Delta\Sigma$ modulator alternates between integer values to resolve a fractional N value;

a two-port voltage-controlled oscillator, the first port receives a control voltage for the phase-locked loop and the second port receives a direct modulation signal;

a second input to the fractional-N phase-locked loop that operates to remove the modulation applied at the voltage-controlled oscillator;

a variable gain amplifier that receives the sequence output of the phase-locked loop and an amplitude-control signal, wherein an envelope characteristic of the phase-modulated signal produced by the phase-locked loop is modulated;

a phase data input circuit that receives the phase modulation data, differentiates the data, and routes the differentiated data to the second input of the fractional-N phase-locked loop as well as the second port of the voltage-controlled oscillator; and an amplitude data input circuit that receives amplitude data and produces a signal that is coupled to a variable gain amplifier, wherein the phase data and the amplitude data experience substantially the same signal delay.

* * * * *